(12) United States Patent
Sperlich et al.

(10) Patent No.: US 6,255,193 B1
(45) Date of Patent: Jul. 3, 2001

(54) METHOD FOR FABRICATING AN ISOLATION TRENCH USING AN AUXILIARY LAYER

(75) Inventors: Hans-Peter Sperlich; Jens Zimmermann, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/494,774

(22) Filed: Jan. 31, 2000

(30) Foreign Application Priority Data

Jan. 29, 1999 (DE) .............................. 199 03 597

(51) Int. Cl.[7] .................................... H01L 21/70
(52) U.S. Cl. ................ 438/430; 438/432; 438/431; 438/435
(58) Field of Search .................... 438/430, 431, 438/432, 435, 424

(56) References Cited

U.S. PATENT DOCUMENTS

| 5,047,815 | 9/1991 | Yashuhira et al. . | |
|---|---|---|---|
| 5,358,891 | 10/1994 | Tsang et al. . | |
| 5,867,420 | * 8/1999 | Alsmeier | 365/149 |
| 5,869,384 | * 2/1999 | Yu et al. | 438/431 |
| 5,933,748 | * 8/1999 | Chou et al. | 438/431 |

FOREIGN PATENT DOCUMENTS

| 10-125770 | of 0000 | (JP) . |
| 8-70108 | of 0000 | (JP) . |

* cited by examiner

*Primary Examiner*—Trung Dang
(74) *Attorney, Agent, or Firm*—Herbert L. Lerner; Laurence A. Greenberg; Werner H. Stemer

(57) ABSTRACT

The fabrication method provides for an etched isolation trench to be lined, if appropriate firstly with a thin thermal oxide layer, and then with an oxidizable auxiliary layer. The auxiliary layer consumes oxygen during subsequent thermal processes, thereby avoiding oxidation of deeper structures, in particular of an insulation collar in a capacitor trench.

6 Claims, 2 Drawing Sheets

METHOD FOR FABRICATING AN ISOLATION TRENCH USING AN AUXILIARY LAYER

BACKGROUND OF THE INVENTION

Field of the Invention

The invention lies in the field of semiconductor technology and semiconductor manufacture.

Isolation trenches are frequently used in integrated circuits in order to insulate neighboring active zones or switching elements from one another. Such trenches, which are arranged in the semiconductor substrate and filled with an insulation material, may have different lateral and vertical dimensions depending on the boundary conditions given. Their surface generally terminates with that of the semiconductor substrate, this being achieved by means of a suitable planarization process. One problem with the use of such isolation trenches is that the trench etching causes crystal damage. Such crystal damage very often has negative consequences for the circuit to be fabricated, owing to the fact that, by way of example, the diffusion of impurity atoms is facilitated or the crystal structure of subsequently applied layers is deleteriously affected.

Although it is generally applicable, the problem underlying the invention is explained using a DRAM memory circuit with trench capacitors. In order to isolate neighboring memory cells, the so-called STI technique (Shallow Trench Isolation) is frequently employed. In the context of memory cells with trench capacitors, this is done, in particular, by means of an arrangement of the isolation trench which partly overlaps two capacitors in each case. In this case, first of all the capacitor trenches are fabricated and filled and then an isolation trench is etched in such a way that it partly covers the upper region of two neighboring trenches.

A conventional prior art method for fabricating the isolation trench is explained with reference to FIGS. 4 to 5. The capacitor trenches 2, 3 of mutually adjacent memory cells are completed in a semiconductor substrate 1. The trench wall is lined with a capacitor dielectric 4 in the lower region and with an insulation collar 5 made of silicon oxide, which is thicker by comparison with the dielectric liner 4, in the upper region. The insulation collar 5 can be removed in the vicinity of the upper edge of the trenches, in order to enable here the subsequent contact with the selection transistor of the cell. The capacitor trench is filled with polysilicon 6, which bears on the trench wall in the vicinity of the upper edge of the trenches. An isolation trench 7 is etched in such a way that the substrate located between the capacitor trenches 2, 3 and that part of the capacitor trenches which adjoins the substrate are covered. A mask for etching the isolation trench covers at least the active zone of the substrate. The trench, i.e., the STI trench, is etched down to a predetermined depth, in this case at least down to the insulation collar 5.

The etching of this STI trench causes damage in the substrate. The damage must be minimized, since the selection transistor of the memory cell is fabricated in the relevant substrate region following the capacitor trench. Annealing is effected by an oxidation process (furnace process or RTP), as a result of which a so-called "liner oxide" 8 is formed on the side wall and the bottom of the isolation trench 7. The liner oxide 8 additionally improves lattice matching during the filling of the isolation trench. The isolation trench is filled with an insulation layer 10.

During subsequent oxidation steps in the process (and to a small extent already during the oxidative annealing), however, structures located at a deeper level may also be oxidized, in particular the insulation collar 5 is oxidized further (see FIG. 2). As a result, there is the risk of crystal defects being formed in the substrate, which adversely affect the electrical properties of the memory cell (for example alternation of the retention time, so-called variable retention time) or lead to complete failure of the cell.

This problem has been countered heretofore by a thin nitride layer as an oxygen barrier on the liner oxide 8. The use of such a nitride layer is not without problems, however, since the lattice matching is not optimal and stresses may be produced. Furthermore, an additional furnace deposition is necessary.

SUMMARY OF THE INVENTION

The object of the invention is to provide a method for fabricating an isolation trench which overcomes the above-noted deficiencies and disadvantages of the prior art devices and methods of this kind, and which, in particular, avoids the oxidation of lower-lying structures.

With the above and other objects in view there is provided, in accordance with the invention, a method for fabricating an isolation trench in a semiconductor structure, which comprises the following steps:

producing a trench in a semiconductor substrate;
forming an oxidizable auxiliary layer; and
filling the trench with an insulation layer.

In other words, the invention is based on the use of an oxidizable auxiliary layer before the trench is filled with an insulation layer. This auxiliary layer consumes the diffusing oxygen during subsequent process steps. The oxidation of deeper structures, for example of an insulation collar of a trench capacitor, is thereby considerably delayed or prevented.

A silicon layer or silicon oxide high in silicon is particularly suitable as the auxiliary layer. The silicon oxide is then completely converted into silicon oxide.

The auxiliary layer may be fabricated in a separate step. It is particularly advantageous, however, for its fabrication to precede directly (in situ) the fabrication of the trench filling. In other words, first the auxiliary layer is deposited and then the insulation layer for filling the trench is deposited, in the same installation without the substrate being exposed to the surrounding atmosphere in the meantime, preferably in the same process chamber. This can be achieved by switching on the participating process gases in a manner that is staggered over time, and/or by changing the relative ratio of the process gases in the overall gas mixture.

In accordance with another feature of the invention, the surface is planarized after the trench has been filled.

In accordance with a further feature of the invention, the trench is etched in an overlapping manner with a capacitor trench in the substrate. A wall of the capacitor trench is at least partly covered with silicon oxide and the capacitor trench is filled with a conductive material.

In accordance with a concomitant feature of the invention, the trench is lined with a thermal oxide prior to the formation of the oxidizable auxiliary layer.

Other features which are considered as characteristic for the invention are set forth in the appended claims.

Although the invention is illustrated and described herein as embodied in a method for fabricating an isolation trench using an auxiliary layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
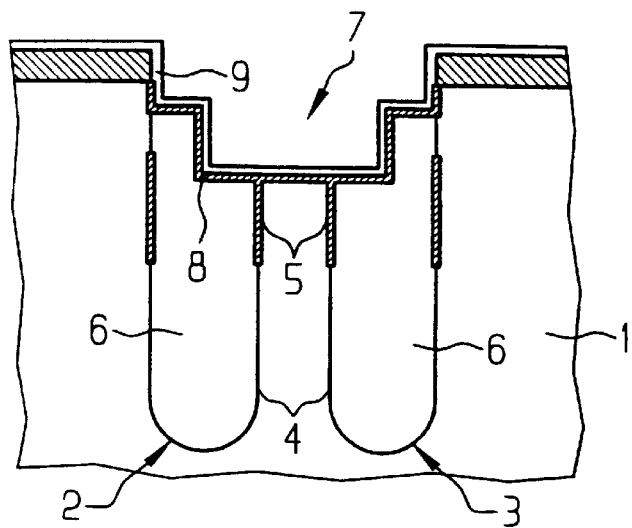
FIGS. 1 to 3 are partial sectional views through a semiconductor substrate on which the method steps of an exemplary embodiment are illustrated.
Figure 4:
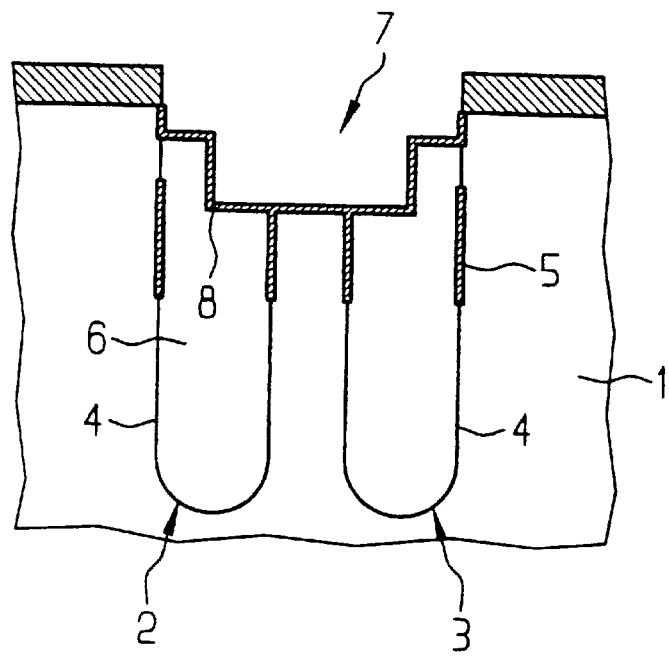
FIGS. 4 to 5 are similar views illustrating a conventional prior art method that was explained in the introductory text.
Figure 5:
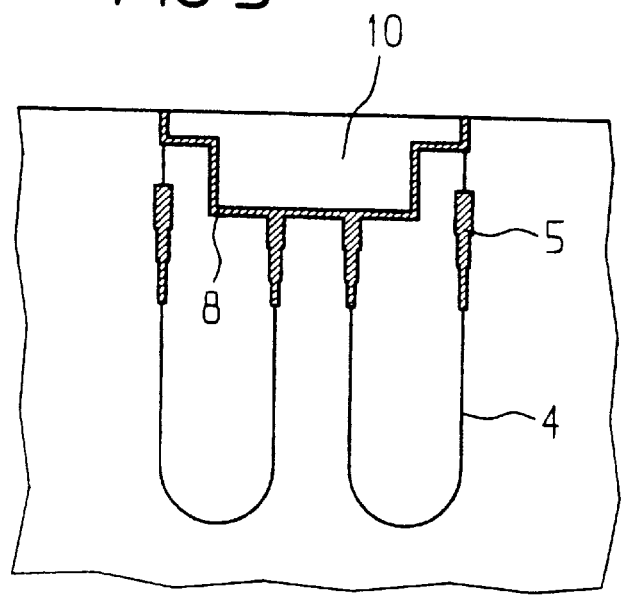

Reference will now be had to the figures of the drawing in which the invention is illustrated in detail. FIG. 1 contains structures that have already be described in connection with FIG. 4 and the conventional method, namely, the semiconductor substrate 1 has capacitor trenches 2, 3 with a capacitor dielectric 4 on the lower trench wall and a thicker insulation collar 5 in the upper region of the trench wall. The insulation collar 5 may be composed of TEOS. In the case of the method variant shown here, the insulation collar 5 is removed from the upper edge of the trenches, that is to say the trench wall is uncovered here. However, it is also possible to provide the entire upper region of the trench wall with the insulation collar. If the intention is to form a lateral (trench wall) contact with the transistor, the insulation collar is then removed only in a subsequent method step at a suitable location. An electrode 6 made, for example, of doped polysilicon is arranged within the capacitor trench. The isolation trench 7 is etched in the same way as in FIG. 4, with the result that it partly overlaps the mutually adjacent capacitor trenches 2, 3. The isolation trench 7 is lined with a thin thermal oxide 8 (liner oxide). In principle, it is also possible to dispense with the liner oxide if the lattice mismatches (which generally lead to increased leakage currents) that are then likely to occur can be tolerated. The present invention now provides for a thin oxidizable auxiliary layer 9 to be applied on the liner oxide 8. In a preferred mode of the invention, an amorphous silicon layer is deposited with a layer thickness of 10 to 40 nm over the whole area.

Figure 2:
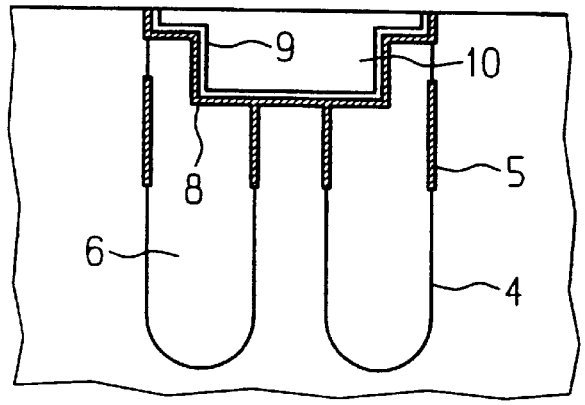

Referring now to FIG. 2, the isolation trench is filled with an insulation layer 10. By means of a planarization process, in particular a CMP method (chemical mechanical polishing), the surface is leveled and the insulation material 10 situated outside the isolation trench is removed. Any residues of further layers on the substrate surface (or the trench etching mask) are also removed. The surface of the isolation trench is then at the same level as the surrounding substrate.

Figure 3:
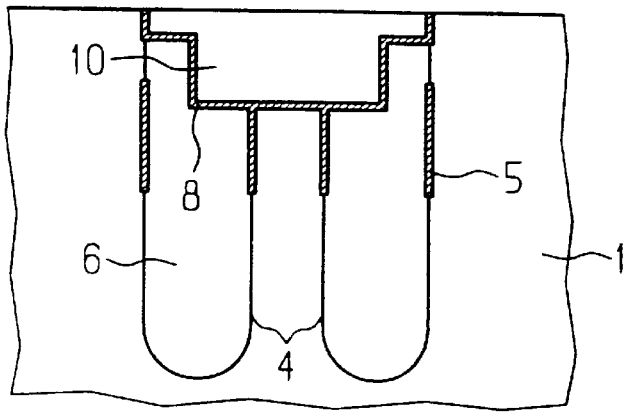

Referring now to FIG. 3, during subsequent thermal processing steps in the course of which oxygen diffuses, the oxidizable auxiliary layer 9 is converted into a silicon oxide by the take-up of the diffusing oxygen. The figure therefore illustrates the silicon oxide uniformly as one with the liner oxide 8.

We claim:

1. A method for fabricating an isolation trench in a semiconductor structure, which comprises the following steps:

producing a trench in a semiconductor substrate;

forming an oxidizable auxiliary layer in situ; and subsequently filling the trench with an insulation layer.

2. The method according to claim 1, wherein the forming step comprises forming a silicon layer as the oxidizable auxiliary layer.

3. The method according to claim 1, wherein the forming step comprises forming a silicon oxide layer high in silicon as the oxidizable auxiliary layer.

4. The method according to claim 1, which comprises planarizing the surface after the trench has been filled.

5. The method according to claim 1, which comprises etching the trench in an overlapping manner with a capacitor trench in the substrate, wherein a wall of the capacitor trench is at least partly covered with silicon oxide and the capacitor trench is filled with a conductive material.

6. The method according to claim 1, which comprises lining the trench with a thermal oxide prior to the step of forming the oxidizable auxiliary layer.

* * * * *